United States Patent
Park et al.

(10) Patent No.: US 9,741,877 B2
(45) Date of Patent: Aug. 22, 2017

(54) COMPOSITION FOR SOLAR CELL ELECTRODE AND ELECTRODE PREPARED USING THE SAME

(71) Applicant: SAMSUNG SDI CO., LTD., Yongin-si, Gyeonggi-do (KR)

(72) Inventors: HyungSeok Park, Uiwang-si (KR); EunKyung Kim, Uiwang-si (KR); Hee In Nam, Uiwang-si (KR); SungIl Moon, Uiwang-si (KR); Young Sil Lee, Uiwang-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 34 days.

(21) Appl. No.: 14/841,777

(22) Filed: Sep. 1, 2015

(65) Prior Publication Data
US 2016/0141433 A1    May 19, 2016

(30) Foreign Application Priority Data
Nov. 19, 2014    (KR) .......................... 10-2014-0161957

(51) Int. Cl.
*H01B 1/22*    (2006.01)
*H01L 31/0224*    (2006.01)

(52) U.S. Cl.
CPC ....... *H01L 31/022425* (2013.01); *H01B 1/22* (2013.01); *Y02E 10/50* (2013.01)

(58) Field of Classification Search
CPC .... H01L 31/022425; Y02E 10/50; H01B 1/22
See application file for complete search history.

(56) References Cited

U.S. PATENT DOCUMENTS

| | | | | |
|---|---|---|---|---|
| 2009/0293766 A1* | 12/2009 | Kamikoriyama | ...... | C09D 11/30 106/31.92 |
| 2010/0096972 A1* | 4/2010 | Shigeta | .................. | B82Y 10/00 313/346 R |

(Continued)

FOREIGN PATENT DOCUMENTS

| | | |
|---|---|---|
| CN | 101111957 | 1/2008 |
| CN | 102412401 A | 4/2012 |

(Continued)

OTHER PUBLICATIONS

Taiwanese Office Action dated Oct. 14, 2016 in Corresponding Taiwanese Patent Application.

(Continued)

*Primary Examiner* — Mark Kopec
*Assistant Examiner* — Jaison Thomas
(74) *Attorney, Agent, or Firm* — Lee & Morse, P.C.

(57) ABSTRACT

A composition for solar cell electrodes, the composition including silver (Ag) powder; a glass frit; an organic binder; and a solvent, the organic binder including a compound containing a repeat unit represented by Formula 1:

[Formula 1]

(Continued)

wherein $R_1$ is $Na^+$, $K^+$, $NH_4^+$, or $PH_3^+$; $R_2$ is a hydrogen atom or a $C_1$ to $C_2$ alkyl group; and n is an integer of 1 to 3,500.

7 Claims, 1 Drawing Sheet

(56) References Cited

U.S. PATENT DOCUMENTS

| | | | | |
|---|---|---|---|---|
| 2012/0070737 | A1* | 3/2012 | Son | C08F 8/14 |
| | | | | 429/217 |
| 2013/0139873 | A1* | 6/2013 | Choi | H01B 1/22 |
| | | | | 136/252 |
| 2013/0140500 | A1* | 6/2013 | Jung | H01B 1/16 |
| | | | | 252/513 |
| 2014/0306166 | A1* | 10/2014 | Jung | H01B 1/22 |
| | | | | 252/514 |
| 2015/0107664 | A1* | 4/2015 | Choi | H01L 31/02242 |
| | | | | 136/256 |
| 2016/0024316 | A1* | 1/2016 | Sasada | C09D 7/12 |
| | | | | 427/553 |

FOREIGN PATENT DOCUMENTS

| | | | | |
|---|---|---|---|---|
| CN | 102592708 | A | 7/2012 | |
| KR | 10-2009-0067991 | A | 6/2009 | |
| KR | 2009-0067991 | * | 6/2009 | ............ H01B 1/22 |
| KR | 10-2012-0029899 | A | 3/2012 | |
| TW | 201026820 | A | 7/2010 | |
| TW | 201330010 | A | 7/2013 | |
| TW | 201431819 | A | 8/2014 | |

OTHER PUBLICATIONS

Korean Office Action dated Sep. 23, 2016 in Corresponding Korean Patent Application No. 10-2014-0161957.
Chinese Office Action dated Oct. 19, 2016.

* cited by examiner

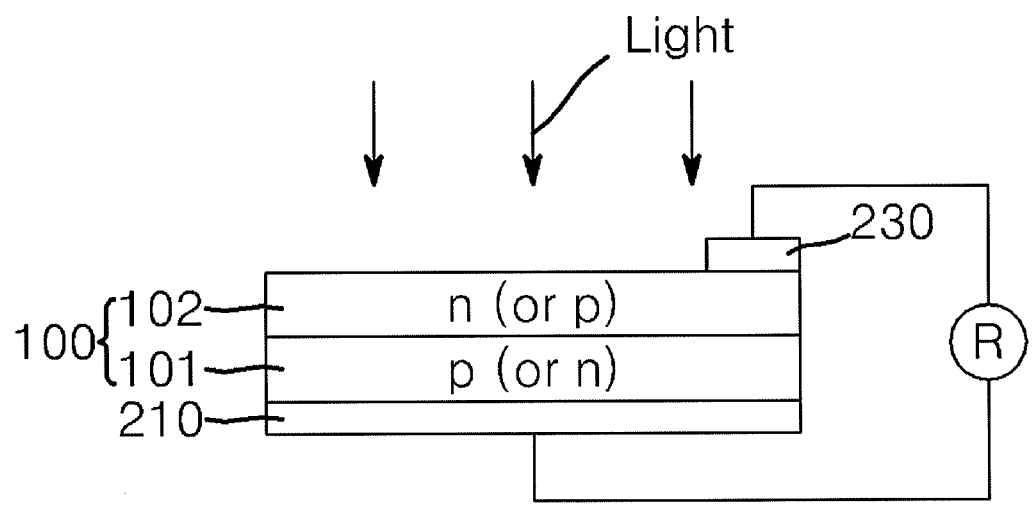

COMPOSITION FOR SOLAR CELL ELECTRODE AND ELECTRODE PREPARED USING THE SAME

CROSS-REFERENCE TO RELATED APPLICATION

Korean Patent Application No. 10-2014-0161957, filed on Nov. 19, 2014, in the Korean Intellectual Property Office, and entitled: "Composition for Solar Cell Electrode and Electrode Prepared Using the Same," is incorporated by reference herein in its entirety.

BACKGROUND

1. Field

Embodiments relate to a composition for solar cell electrodes and an electrode prepared using the same.

2. Description of the Related Art

Solar cells may generate electric energy using the photovoltaic effect of a p-n junction which may convert photons of sunlight into electricity. In the solar cell, front and rear electrodes may be formed on upper and lower surfaces of a semiconductor wafer or substrate with the p-n junction, respectively. Then, the photovoltaic effect of the p-n junction may be induced by sunlight entering the semiconductor wafer and electrons generated by the photovoltaic effect of the p-n junction may provide electric current to the outside through the electrodes. The electrodes of the solar cell may be formed on the wafer by applying, patterning, and baking a composition for electrodes.

SUMMARY

Embodiments may be realized by providing a composition for solar cell electrodes, the composition including silver (Ag) powder; a glass frit; an organic binder; and a solvent, the organic binder including a compound containing a repeat unit represented by Formula 1:

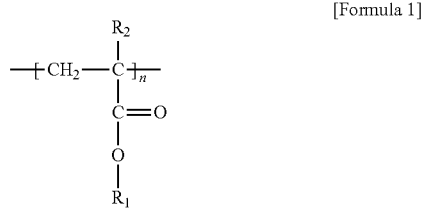

[Formula 1]

wherein $R_1$ is $Na^+$, $K^+$, $NH_4^+$, or $PH_3^+$; $R_2$ is a hydrogen atom or a $C_1$ to $C_2$ alkyl group; and n is an integer of 1 to 3,500.

The organic binder may include a compound containing repeat units represented by Formula 2:

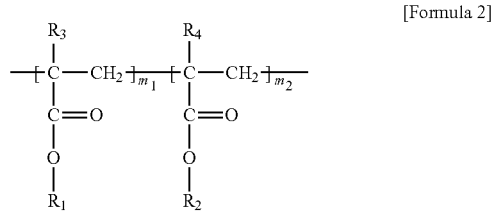

[Formula 2]

wherein $R_1$ is $Na^+$, $K^+$, $NH_4^+$, or $PH_3^+$; $R_2$ is a hydrogen atom, a $C_1$ to $C_6$ alkyl group, a hydroxypropyl group, or a hydroxyethyl group; $R_3$ and $R_4$ are each independently a hydrogen atom or a $C_1$ to $C_2$ alkyl group; and m1 and m2 are each independently an integer of 1 to 3,000.

The composition may include about 60 wt % to about 95 wt % of the silver (Ag) powder; about 0.5 wt % to about 20 wt % of the glass frit; about 1 wt % to about 30 wt % of the organic binder; and about 1 wt % to about 30 wt % of the solvent, based on a total weight of the composition.

The glass frit may include one or more of lead (Pb), tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), or aluminum (Al).

The solvent may include one or more of methyl cellosolve, ethyl cellosolve, butyl cellosolve, aliphatic alcohols, α-terpineol, β-terpineol, dihydro-terpineol, ethylene glycol, ethylene glycol monobutylether, butyl cellosolve acetate, or 2,2,4-trimethyl-1,3-pentanediol monoisobutyrate.

The glass frit may have an average particle diameter (D50) of about 0.1 μm to about 10 μm.

The composition may further include one or more thixotropic agents, viscosity stabilizers, anti-foaming agents, pigments, UV stabilizers, antioxidants, or coupling agents.

Embodiments may be realized by providing a solar cell electrode prepared from the composition for solar cell electrodes.

BRIEF DESCRIPTION OF THE DRAWINGS

Features will become apparent to those of skill in the art by describing in detail exemplary embodiments with reference to the attached drawings in which:

FIG. 1 illustrates a schematic view of a solar cell according to one embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Composition for Solar Cell Electrodes

The composition for solar cell electrodes may include silver (Ag) powder; glass fits; an organic binder; and a solvent. Now, each component of the composition for solar cell electrodes will be described in more detail.

(A) Silver Powder

The composition for solar cell electrodes may include silver (Ag) powder as a conductive powder. The particle size of the silver powder may be on a nanometer or micrometer scale. For example, the silver powder may have a particle size of dozens to several hundred nanometers, or several to dozens of micrometers. In an embodiment, the silver powder may be a mixture of two or more types of silver powders having different particle sizes.

The silver powder may have a spherical, flake or amorphous shape.

The silver powder may have an average particle diameter (D50) of about 0.1 μm to about 10 μm, for example, about 0.5 μm to about 5 μm. The average particle diameter may be measured using a Model 1064LD particle size analyzer (Cilas Co., Ltd.) after dispersing the conductive powder in isopropyl alcohol (IPA) at 25° C. for 3 minutes via ultrasonication. Within this range, the composition may provide low contact resistance and low line resistance.

The silver powder may be present in an amount of about 60 wt % to about 95 wt % based on the total weight of the composition. Within this range, the conductive powder may prevent deterioration in conversion efficiency, for example, due to increase in resistance, and difficulty in forming a paste, for example, due to relative reduction in amount of the organic vehicle. For example, the silver powder may be present in an amount of about 70 wt % to about 90 wt %. In one embodiment, the silver powder may be present in an amount of about 60 wt %, 61 wt %, 62 wt %, 63 wt %, 64 wt %, 65 wt %, 66 wt %, 67 wt %, 68 wt %, 69 wt %, 70 wt %, 71 wt %, 72 wt %, 73 wt %, 74 wt %, 75 wt %, 76 wt %, 77 wt %, 78 wt %, 79 wt %, 80 wt %, 81 wt %, 82 wt %, 83 wt %, 84 wt %, 85 wt %, 86 wt %, 87 wt %, 88 wt %, 89 wt %, 90 wt %, 91 wt %, 92 wt %, 93 wt %, 94 wt %, or 95 wt %.

(B) Glass Frit

The glass fits may enhance adhesion between the conductive powder and the wafer and may form silver crystal grains in an emitter region by etching the anti-reflection film and melting the silver powder, and contact resistance may be reduced during the baking process of the composition for electrodes. During the baking process, the glass fits may soften and decrease the baking temperature.

The area of the solar cell may be increased to improve solar cell efficiency, there may be a problem of increase in solar cell contact resistance, and it may be necessary to minimize both serial resistance (Rs) and influence on the p-n junction. The baking temperatures may vary within a broad range with increasing use of various wafers having different sheet resistances, and it may be desirable that the glass frits secure sufficient thermal stability to withstand a wide range of baking temperatures.

The glass frits may be any of leaded glass frits and lead-free glass frits, which may be used in compositions for solar cell electrodes in the art.

The glass frits may include one or more of lead (Pb), tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), or aluminum (Al).

The glass frits may be prepared from oxides of the aforementioned metallic elements by any method used in the art. For example, the oxides may be mixed in a predetermined ratio. Mixing may be carried out using a ball mill or a planetary mill. The mixture may be melted at about 700° C. to about 1300° C., followed by quenching to 25° C. The obtained resultant may be subjected to pulverization using, for example, a disk mill or a planetary mill, and glass fits may be prepared.

The glass frits may have an average particle diameter (D50) of about 0.1 μm to about 10 μm. The glass fits may have, for example, a spherical or amorphous shape.

In some embodiments, the glass frit may be present in an amount of about 0.5 wt % to about 20 wt % based on the total weight of the composition for solar cell electrodes. Within this range, the glass frit may secure excellent adhesive strength and excellent conversion efficiency given varying surface resistances while minimizing serial resistance, and solar cell efficiency may be improved. In one embodiment, the glass frits may be present in an amount of about 0.5 wt %, 1 wt %, 1.5 wt %, 2 wt %, 2.5 wt %, 3 wt %, 3.5 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, or 20 wt %.

The composition may include two types of glass fits having different glass transition temperatures. For example, the composition may include a mixture of first glass frits having a glass transition temperature of about 200° C. to about 350° C. and second glass frits having a glass transition temperature higher than 350° C. and less than or equal to 550° C., wherein a weight ratio of the first glass frits to the second glass frits may range from about 1:0.2 to about 1:1.

(C) Organic Binder

The organic binder may include a compound containing a repeat unit or moiety represented by Formula 1:

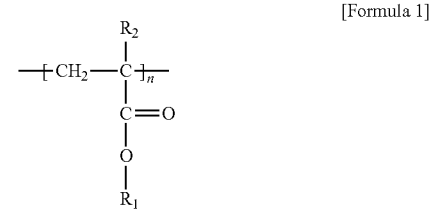

[Formula 1]

wherein $R_1$ is $Na^+$, $K^+$, $NH_4^+$, or $PH_3^+$; $R_2$ is a hydrogen atom or a $C_1$ to $C_2$ alkyl group; and n is an integer of 1 to 3,500. Formula 1 may also be represented as follows:

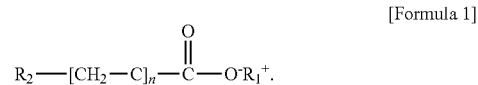

[Formula 1]

The organic binder according to one embodiment may include an acrylic compound containing repeat units or moieties represented by Formula 2:

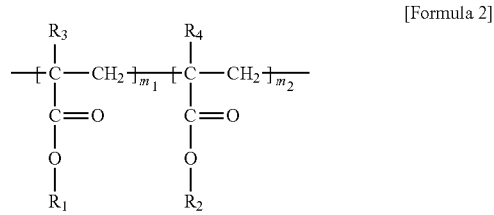

[Formula 2]

wherein $R_1$ is $Na^+$, $K^+$, $NH_4^+$, or $PH_3^+$; $R_2$ is a hydrogen atom, a $C_1$ to $C_6$ alkyl group, a hydroxypropyl group, or a hydroxyethyl group; $R_3$ and $R_4$ are each independently a hydrogen atom or a $C_1$ to $C_2$ alkyl group; and m1 and m2 are each independently an integer of 1 to 3,000. In an embodiment, the acrylic compound containing repeat units or moieties represented by Formula 2 is not a block copolymer.

The acrylic compound represented by Formula 2 may be prepared by heterogeneous polymerization of the acrylic compound represented by Formula 1, as a first monomer, with at least one monomer, as a second monomer, selected from among, for example, (meth)acrylic acid, methyl (meth) acrylate, hydroxyethyl acrylate (HEA), hydroxyethyl methacrylate (HEMA), hydroxy (meth)acrylate, propyl (meth) acrylate, hydroxypropyl (meth)acrylate, and butyl (meth) acrylate. As used herein, the term "(meth)acryl" may refer to acryl and/or methacryl, and the term "(meth)acrylate" may refer to acrylates and/or methacrylates.

The organic binder may reduce a phenomenon wherein ionic bonds of oxygen anions (O) and monovalent cations ($R_1$) may be rearranged at high temperature, causing a paste to crumble and widen, thereby allowing realization of fine patterns with a high aspect ratio. The organic binder may induce electrical binding of oxygen to surface charges of silver (Ag) particles, thereby providing maximized dispersibility of the silver (Ag) particles and enhanced storage stability, whereby excellent electrical resistivity may eventually be obtained by virtue of improved dispersibility.

The organic binder may have a weight average molecular weight (Mw) of about 5,000 g/mol to about 200,000 g/mol.

The organic binder may be present in an amount of about 1 wt % to about 30 wt % based on the total weight of the composition for solar cell electrodes. Within this range, it may be possible to prevent excessive reduction in viscosity of the prepared composition or deterioration in adhesion between the composition and a substrate. It may be possible to avoid increase of resistance, for example, due to poor decomposition of the organic binder during baking, which may be caused by an excess of the organic binder, and may prevent an electrode from suffering from, for example, cracking, splitting, or pinhole defects, during baking. For example, the organic binder may be present in an amount of about 5 wt % to about 15 wt %. In one embodiment, the organic binder may be present in an amount of about 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, or 30 wt %.

(D) Solvent

The solvent may have a boiling point of 100° C. or higher, and may include one or more of methyl cellosolve, ethyl cellosolve, butyl cellosolve, aliphatic alcohols, α-terpineol, β-terpineol, dihydro-terpineol, ethylene glycol, ethylene glycol monobutyl ether, butyl cellosolve acetate, or 2,2,4-trimethyl-1,3-pentanediol monoisobutyrate (Texanol™).

The organic solvent may be present in an amount of about 1 wt % to about 30 wt % based on the total weight of the composition for solar cell electrodes. Within this range, the solvent may provide sufficient adhesive strength and excellent printability to the composition. In one embodiment, the solvent may be present in an amount of about 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, or 30 wt %.

(E) Additives

The composition may further include additives to enhance fluidity and process properties and stability. The additives may include, for example, thixotropic agents, viscosity stabilizers, anti-foaming agents, pigments, UV stabilizers, antioxidants, and coupling agents. These additives may be used alone or as mixtures thereof. These additives may be present in an amount of about 0.1 wt % to about 5 wt % based on the total weight of the composition for solar cell electrodes. The content of the additives may be changed. In one embodiment, the additives may be present in an amount of about 0.1 wt %, 0.2 wt %, 0.3 wt %, 0.4 wt %, 0.5 wt %, 0.6 wt %, 0.7 wt %, 0.8 wt %, 0.9 wt %, 1 wt %, 1.5 wt %, 2 wt %, 2.5 wt %, 3 wt %, 3.5 wt %, 4 wt %, 4.5 wt %, or 5 wt %.

Solar Cell Electrode and Solar Cell Including the Same

Other aspects of embodiments relate to an electrode formed of the composition for solar cell electrodes and a solar cell including the same. FIG. 1 shows a solar cell in accordance with one embodiment.

Referring to FIG. 1, a rear electrode 210 and a front electrode 230 may be formed by printing and baking the composition on a wafer or substrate 100 that may include a p-layer (or n-layer) 101 and an n-layer (or p-layer) 102, which may serve as an emitter. For example, a preliminary process of preparing the rear electrode 210 may be performed by printing the composition on the rear surface of the wafer 100 and drying the printed composition at about 200° C. to about 400° C. for about 10 seconds to 60 seconds. A preliminary process for preparing the front electrode may be performed by printing the paste on the front surface of the wafer and drying the printed composition. Then, the front electrode 230 and the rear electrode 210 may be formed by baking the wafer at about 400° C. to about 980° C., for example, at about 700° C. to about 980° C., for about 30 seconds to 210 seconds.

The following Examples and Comparative Example are provided in order to highlight characteristics of one or more embodiments, but it will be understood that the Examples and Comparative Example are not to be construed as limiting the scope of the embodiments, nor is the Comparative Example to be construed as being outside the scope of the embodiments. Further, it will be understood that the embodiments are not limited to the particular details described in the Examples and Comparative Example.

Preparative Example 1

In a round bottom flask equipped with a condenser under a nitrogen atmosphere, sodium acrylate and distilled water were placed in a weight ratio of 1:2, followed by stirring while heating to 60° C. After completion of stirring, based on the total moles of the sodium acrylate, 0.1 mole % of potassium sulfate was introduced as an initiator into the mixed liquid, and thoroughly dissolved. The obtained resultant was slowly dropped into a separate flask using a dropping funnel. After completion of dropping, radical polymerization was performed at 60° C. for 24 hours under a nitrogen atmosphere. Thereafter, the reaction product was precipitated in methanol several times, followed by filtering to remove solvent residues, unreacted materials, and oligomers, thereby obtaining a white powder of an acrylic compound (SPA-1) including a moiety represented by Formula 3:

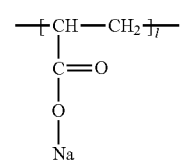

[Formula 3]

where l=2,000.

Preparative Example 2

Into a round bottom flask equipped with a condenser under a nitrogen atmosphere, an acrylic monomer and methyl cellosolve were placed in a weight ratio of 1:2. The acrylic monomer included 5 equivalent weight (eq) of sodium acrylate, 80 eq of acrylic acid, and 15 eq of methyl methacrylate. The acrylic monomer and the methyl cellosolve were stirred while heating to 60° C. After completion of stirring, based on the total moles of the acrylic monomer, 0.1 mole % of azoisobutyronitrile (AIBN) was introduced as an initiator into the mixed liquid, and thoroughly dissolved. The obtained resultant was slowly dropped into a separate flask using a dropping funnel. After completion of dropping, radical polymerization was performed at 60° C. for 24 hours under a nitrogen atmosphere. Thereafter, the reaction product was precipitated in ethyl acetate several times, followed by filtering to remove solvent residues, unreacted materials, and oligomers, thereby obtaining a white powder of an acrylic compound (SPA-2) including moieties independently represented by x, y, and z units of Formula 4:

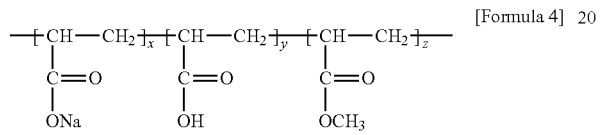

[Formula 4]

where x=37, y=601, and z=112.

Preparative Example 3

A white powder of an acrylic compound (SPA-3) was obtained in the same manner as in Preparative Example 2 except that the acrylic monomer included 5 eq of sodium acrylate, 80 eq of acrylic acid, and 15 eq of benzyl methacrylate, in which the acrylic compound included moieties represented by x, y, and z units of Formula 5:

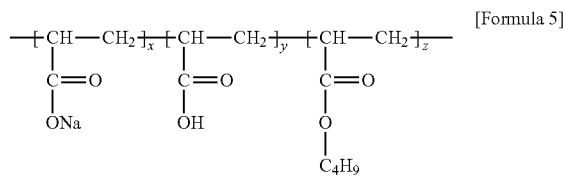

[Formula 5]

where x=32, y=522, and z=98.

Examples 1 to 3 and Comparative Example 1

Example 1

As an organic binder, 3.0 wt % of SPA-1 prepared in Preparative Example 1 was sufficiently dissolved in 4.0 wt % of butyl carbitol at 60° C., and 87.0 wt % of spherical silver powder (5-11F, Dowa Hightech Co., Ltd.) having an average particle diameter of 2.0 μm, 2.0 wt % of a low melting point leaded glass frit (leaded glass, CI-124, Particlogy Co., Ltd.) having an average particle diameter of 1.0 μm and a glass transition temperature of 341° C., 1.5 wt % of a dispersant BYK102 (BYK-Chemie), and 2.5 wt % of a thixotropic agent Thixatrol ST (Elementis Co., Ltd.) were added to the binder solution, followed by mixing and kneading in a 3-roll kneader, thereby preparing a composition for solar cell electrodes.

Examples 2 to 3

Compositions for solar cell electrodes were prepared in the same manner as in Example 1 except that the compositions were prepared in amounts as listed in Table 1.

Comparative Example 1

A composition for solar cell electrodes was prepared in the same manner as in Example 1 except that benzyl methacrylate (BEMA, Sigma-Aldrich Corporation) was used as the organic binder instead of SPA-1.

Method for Property Evaluation (1) Storage stability (%): Each of the prepared compositions for electrodes was evaluated as to storage stability based on a rate of change in viscosity before/after storage in accordance with Equation 1. Results are shown in Table 1.

$$\Delta F = \frac{F_1}{F_0} \times 100$$ [Equation 1]

where $F_0$ is a viscosity value measured at room temperature after storage at 25° C. and at 50±5% RH for 1 day and $F_1$ is a viscosity value measured at room temperature after storage at 25° C. and at 50±5% RH for 30 days.

※ Measurement of viscosity: Before each measurement, a preshear was applied to the samples at 25° C. for 30 seconds at 10 rpm using a viscometer (HBDV-2+pro, Brookfield Engineering) with an SC4-14 spindle and an SC4-6RP chamber.

(2) Evaluation of fine pattern: Each of the prepared compositions was deposited over a front surface of a poly p-type silicon wafer having a sheet resistance of 90Ω by screen-printing using a screen mask to print electrode patterns (finger bars), followed by drying in an IR drying furnace. Then, the composition containing aluminum was printed on a rear surface of the wafer and dried in the same manner as above. Cells formed according to this procedure were subjected to baking at 400° C. to 950° C. for 30 seconds to 50 seconds in a belt-type baking furnace. In order to confirm disconnection of the prepared electrodes (finger bars), the number of line opens was measured using an EL tester (MV Tech Inc.). Further, the line width and thickness of electrode lines were measured using a tester VK9710 (Keyence Co., Ltd.). Results are shown in Table 1.

Screen mask: SUS325 type/Emulsion thickness: 15 μm/line width of finger bars: 45 μm/number of finger bars: 80)

TABLE 1

| | | Example 1 | Example 2 | Example 3 | Comparative Example 1 |
|---|---|---|---|---|---|
| Composition (wt %) | Silver powder | 87 | 87 | 87 | 87 |
| | Glass frit | 2 | 2 | 2 | 2 |
| | Organic binder | 3 (SPA-1) | 3 (SPA-2) | 3 (SPA-3) | 3 (BEMA) |
| | Organic solvent | 4 | 4 | 4 | 4 |
| | Additives | 4 | 4 | 4 | 4 |
| Properties | Storage stability (%) | 2 | 2.7 | 2.3 | 5 |
| | Linewidth after printing | 53 | 56 | 57 | 63 |

TABLE 1-continued

|  | Example 1 | Example 2 | Example 3 | Comparative Example 1 |
|---|---|---|---|---|
| L1 (μm) Linewidth after drying | 60 | 62 | 62 | 75 |
| L2 (μm) Linewidth after baking | 68 | 67 | 68 | 93 |
| L3 (μm) Thickness after baking | 20 | 19 | 19 | 15 |
| D1 (μm) Linewidth Δ (L1-L2) (μm) | −7 | −6 | −5 | −12 |
| Aspect ratio (D1/L3) | 0.294 | 0.283 | 0.279 | 0.16 |

In Table 1, it can be seen that the compositions for solar cell electrodes of Examples 1 to 3 wherein the compound represented by Formula 1 was used as the organic binder exhibited excellent properties in terms of storage stability and aspect ratio, as compared with that of Comparative Example 1, thereby realizing a fine linewidth.

By way of summation and review, to improve conversion efficiency of solar cell electrodes, a composition for solar cell electrodes may be prepared to provide minimized contact resistance (Rc) and serial resistance (Rs) by enhancing contact efficiency with respect to a wafer, or a composition for solar cell electrodes may be prepared to increase short circuit current (Isc) by forming fine lines through adjustment of a linewidth of a screen mask pattern using an organic material. However, the method of decreasing the linewidth of electrodes using the screen mask may cause an increase in serial resistance (Rs) and deterioration in continuous printability of fine patterns.

A composition for solar cell electrodes may employ an organic vehicle to impart suitable viscosity and rheological characteristics for printing, and the organic vehicle may include, for example, an organic binder and a solvent. The organic binder may be selected from cellulose resins or acrylate resins. Ethyl cellulose may be used as the organic binder. Such an organic binder may have a problem in that solubility of the organic binder in a solvent must be considered.

To enhance dispersibility and storage stability, the content of an organic binder may be increased, or a high molecular weight organic binder may be used. When the content of the organic binder is increased, the resulting electrode may have high resistance. When the high molecular weight organic binder is used, viscosity of a composition for electrodes may become higher even at high shear rate, thereby causing tailing and printing defects.

Although the composition may include additives to enhance dispersibility and storage stability, dispersants such as polyvinyl pyrrolidone may have poor solubility in an organic solvent, and low molecular weight additives, such as plasticizers, may suffer from phase separation in long-term storage, thereby providing a negative effect on storage stability of pastes.

Therefore, provided is an organic binder that may improve dispersibility and storage stability without a need for separate additives, while guaranteeing solubility in a solvent.

Provided is a composition for solar cell electrodes that may have excellent properties in terms of dispersibility and storage stability. Provided is a composition for solar cell electrodes that may allow formation of fine patterns and exhibits excellent printability. Provided is an electrode that may be prepared from the composition.

The composition for solar cell electrodes according to embodiments may have excellent properties in terms of dispersibility and storage stability, allows formation of fine patterns, and exhibits excellent printability.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for solar cell electrodes, the composition comprising:
   silver (Ag) powder;
   a glass frit;
   an organic binder; and
   a solvent,
   the organic binder including a compound containing a repeat unit represented by Formula 2:

[Formula 2]

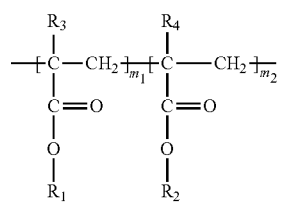

wherein $R_1$ is $Na^+$, $K^+$, $NH_4^+$, or $PH_3^+$; $R_2$ is a hydrogen atom, a $C_1$ to $C_6$ alkyl group, a hydroxypropyl group, or a hydroxyethyl group; $R_3$ and $R_4$ are each independently a hydrogen atom or a $C_1$ to $C_2$ alkyl group; and m1 and m2 are each independently an integer of 1 to 3,000.

2. The composition according as claimed in claim 1, comprising:
   about 60 wt % to about 95 wt % of the silver (Ag) powder;
   about 0.5 wt % to about 20 wt % of the glass frit;
   about 1 wt % to about 30 wt % of the organic binder; and
   about 1 wt % to about 30 wt % of the solvent,
   based on a total weight of the composition.

3. The composition according as claimed in claim 1, wherein the glass frit includes one or more of lead (Pb), tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), or aluminum (Al).

4. The composition according as claimed in claim 1, wherein the solvent includes one or more of methyl cellosolve, ethyl cellosolve, butyl cellosolve, aliphatic alcohols, α-terpineol, β-terpineol, dihydro-terpineol, ethylene glycol, ethylene glycol monobutylether, butyl cellosolve acetate, or 2,2,4-trimethyl-1,3-pentanediol monoisobutyrate.

5. The composition according as claimed in claim 1, wherein the glass frit has an average particle diameter (D50) of about 0.1 μm to about 10 μm.

6. The composition according as claimed in claim 1, further comprising one or more thixotropic agents, viscosity stabilizers, anti-foaming agents, pigments, UV stabilizers, antioxidants, or coupling agents.

7. A solar cell electrode prepared from the composition for solar cell electrodes as claimed in claim 1.

\* \* \* \* \*